(12) United States Patent
Chiang et al.

(10) Patent No.: US 9,306,160 B2
(45) Date of Patent: Apr. 5, 2016

(54) MEMORY DEVICE HAVING OXYGEN CONTROL LAYERS AND MANUFACTURING METHOD OF SAME

(71) Applicant: Macronix International Co., Ltd., Hsinchu (TW)

(72) Inventors: Kuang-Hao Chiang, Pingzhen (TW); Dai-Ying Lee, Hukou Township (TW); Erh-Kun Lai, Taichung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/309,665

(22) Filed: Jun. 19, 2014

(65) Prior Publication Data

US 2015/0372228 A1     Dec. 24, 2015

(51) Int. Cl.
| | |
|---|---|
| *H01L 29/02* | (2006.01) |
| *H01L 47/00* | (2006.01) |
| *H01L 45/00* | (2006.01) |
| *G11C 13/00* | (2006.01) |

(52) U.S. Cl.
CPC ............... *H01L 45/08* (2013.01); *H01L 45/12* (2013.01); *H01L 45/1233* (2013.01); *H01L 45/146* (2013.01); *H01L 45/1608* (2013.01); *H01L 45/1641* (2013.01); *G11C 13/0007* (2013.01)

(58) Field of Classification Search
CPC ............................. G11C 13/0007; H01L 45/08
See application file for complete search history.

(56) References Cited

U.S. PATENT DOCUMENTS

| | | | | |
|---|---|---|---|---|
| 2012/0049145 | A1* | 3/2012 | Lee et al. | 257/3 |
| 2012/0091427 | A1* | 4/2012 | Chen et al. | 257/5 |
| 2012/0267598 | A1* | 10/2012 | Sakotsubo et al. | 257/4 |
| 2013/0214236 | A1* | 8/2013 | Lu et al. | 257/4 |

OTHER PUBLICATIONS

Chen, Yang Yin et al., "Improvement of data retention in $HfO_2$/ Hf 1T1R RRAM cell under low operating current", IEEE 2013, pp. 10.1.1-10.1.4.

* cited by examiner

*Primary Examiner* — Zandra Smith
*Assistant Examiner* — Evan Clinton
(74) *Attorney, Agent, or Firm* — Finnegan, Henderson, Farabow, Garrett & Dunner LLP

(57) ABSTRACT

A memory device includes a first metal layer and a second metal layer, a metal oxide layer disposed between the first metal layer and the second metal layer, and at least one oxygen control layer disposed between the metal oxide layer and at least one of the first metal layer and the second metal layer. The at least one oxygen control layer has a graded oxygen content.

13 Claims, 5 Drawing Sheets

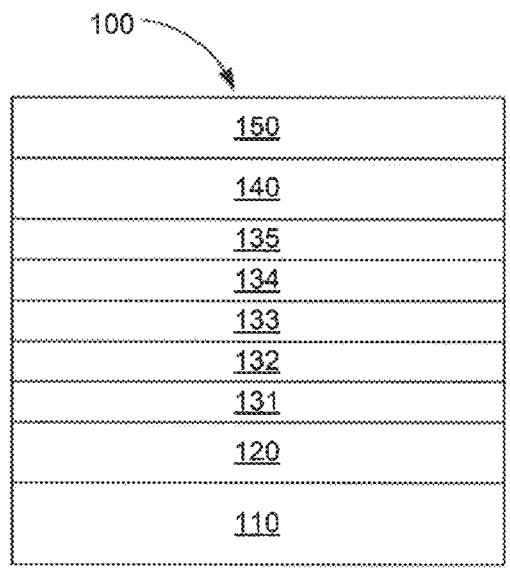
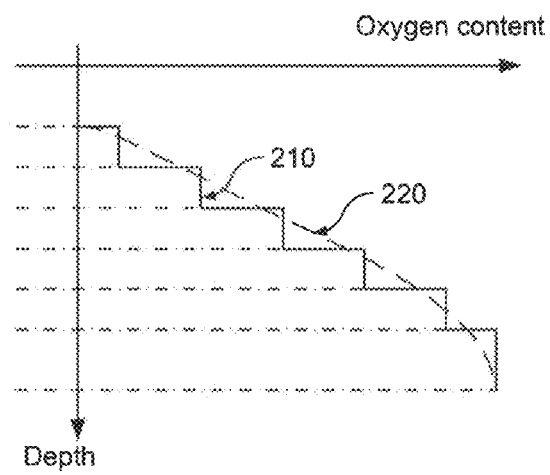
FIG. 1      FIG. 2
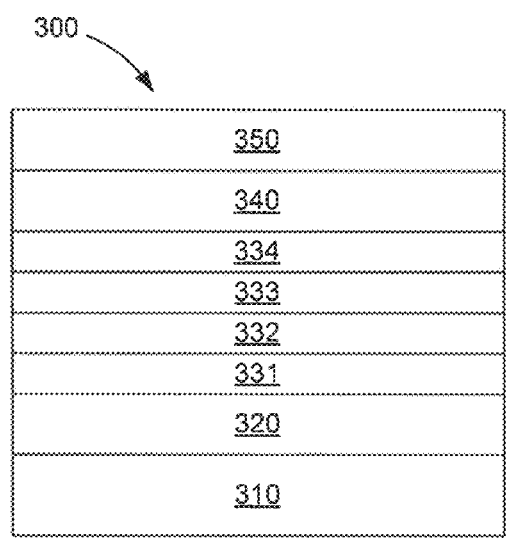
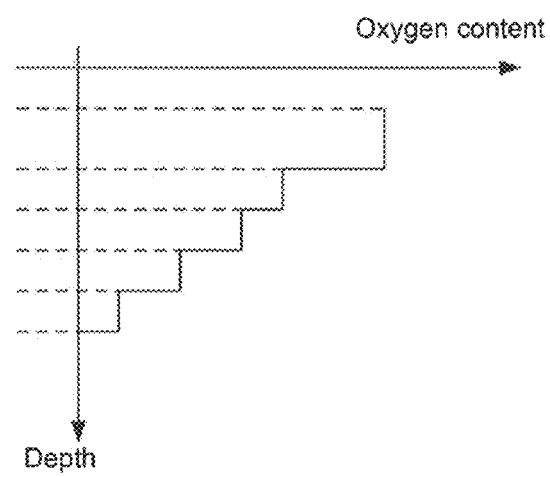
FIG. 3      FIG. 4

MEMORY DEVICE HAVING OXYGEN CONTROL LAYERS AND MANUFACTURING METHOD OF SAME

BACKGROUND

1. Field of the Disclosure

The present disclosure relates to a memory device and a manufacturing method of the same and, more particularly, to a memory device having oxygen control layers.

2. Background

A metal oxide based memory device has been widely developed because of its relatively simply structure and small cell size. The metal oxide memory device includes a metal oxide layer including oxygen mobile ions and oxygen vacancies. The oxygen mobile ions and oxygen vacancies can be moved by application of electrical voltages across top and bottom electrodes of the metal oxide based memory device. As a result, performance of the metal oxide based memory device is dependent on the oxygen content of the metal oxide layer.

SUMMARY

According to an embodiment of the disclosure, a memory device includes a first metal layer and a second metal layer, a metal oxide layer disposed between the first metal layer and the second metal layer, and at least one oxygen control layer disposed between the metal oxide layer and at least one of the first metal layer and the second metal layer. The at least one oxygen control layer has a graded oxygen content.

According to another embodiment of the disclosure, a method of manufacturing a memory device includes forming a first metal layer, forming a metal oxide layer over the first metal layer, forming a second metal layer over the metal oxide layer, and forming at least one oxygen control layer between the metal oxide layer and at least one of the first metal layer and the second metal layer. The at least one oxygen control layer has a graded oxygen content.

BRIEF DESCRIPTION OF THE DRAWINGS

FIG. 1 is a cross-sectional view of a memory device according to an illustrated embodiment.

FIG. 2 schematically illustrates an oxygen profile of the memory device of FIG. 1, according to an embodiment.

FIG. 3 is a cross-sectional view of a memory device according to another illustrated embodiment.

FIG. 4 schematically illustrates an oxygen profile of the memory device of FIG. 3, according to an embodiment.

DETAILED DESCRIPTION

Figures 5, 6:
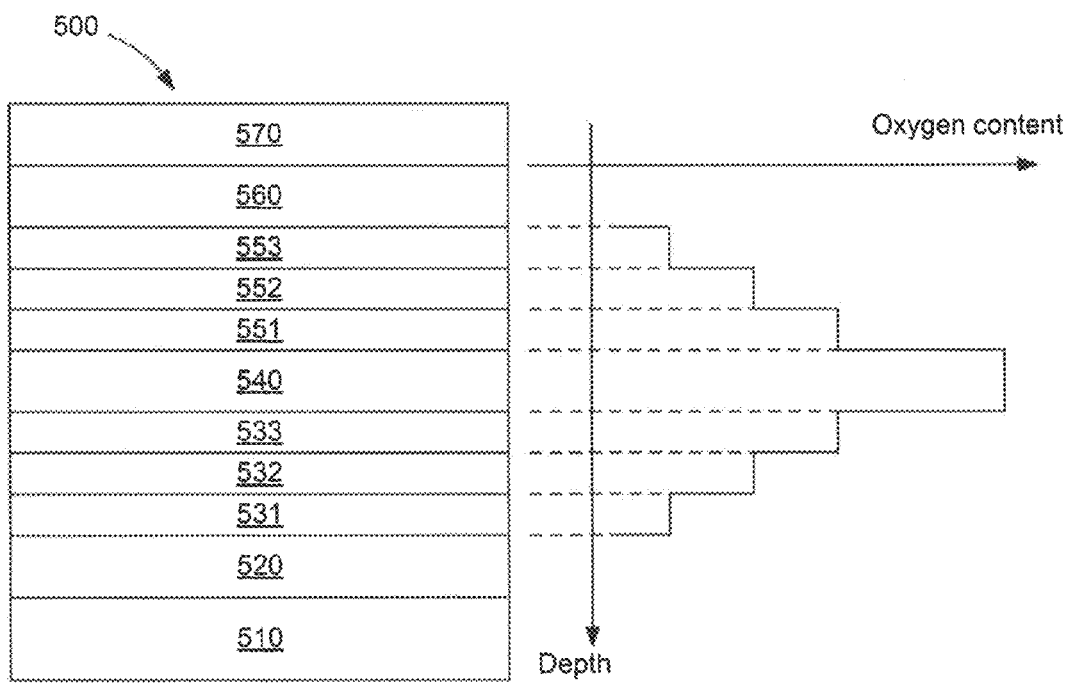
FIG. 5 is a cross-sectional view of a memory device according to still another illustrated embodiment.
FIG. 6 schematically illustrates an oxygen profile of the memory device of FIG. 5, according to an embodiment.

Reference will now be made in detail to the present embodiments, examples of which are illustrated in the accompanying drawings. Wherever possible, the same reference numbers will be used throughout the drawings to refer to the same or like parts.

A memory device according to an embodiment of the disclosure includes a first metal layer and a second metal layer, a metal oxide layer disposed between the first metal layer and the second metal layer, and at least one oxygen control layer disposed between the metal oxide layer and at least one of the first metal layer and the second metal layer. The at least one oxygen control layer have a graded oxygen content, i.e., an oxygen content that changes over a thickness of the layer. The memory device can further include a barrier layer disposed between the plurality of oxygen control layers and the at least one of the first metal layer and the second metal layer.

Each one of the first metal layer and the second metal layer can be formed of a metal selected from a group consisting of W, Ti, TiN, Al, Ni, Cu, Zr, Nb, Ta, Yb, Tb, Y, La, Sc, Hf, Zr, Cr, V, Zn, Mo, Re, Ru, Co, Rh, Pd, and Pt, or any combination of these metals. The metal oxide layer can be formed of a metal oxygen compound represented by $AO_x$, wherein A is a metal selected from a group consisting of W, Ti, TiN, Al, Ni, Cu, Zr, Nb, and Ta, or any combination of these metals. The at least one oxygen control layer can be formed of a compound represented by $AO_xB_y$, wherein A is a metal selected from a group consisting of W, Ti, TiN, Al, Ni, Cu, Zr, Nb, and Ta, or any combination of these metals, and B is an element selected from a group consisting of N, Si, Ge, As, Ga, In, and P, or any combination of these elements. The at least one oxygen control layer has an x-to-y ratio that changes over the thickness of the layer, resulting in grading of the oxygen content. The barrier layer can be formed of a compound represented by AB, with A being a metal selected from a group consisting of W, Ti, TiN, Al, Ni, Cu, Zr, Nb, and Ta, and any combination of these metals, and B being an element selected from a group consisting of N, Si, Ge, As, Ga, In, and P, or any combination of these elements.

FIG. 1 is a cross-sectional view of a memory device 100 according to an illustrated embodiment. Memory device 100 includes a first metal layer 110, a metal oxide layer 120 formed on first metal layer 110, first through fifth oxygen control layers 131-135 sequentially formed on metal oxide layer 120, a barrier layer 140 formed on fifth oxygen control layer 135, and a second metal layer 150 formed on barrier layer 140. First through fifth oxygen control layers 131-135 have different oxygen contents. None of first through fifth oxygen control layers 131-135 has an oxygen content greater than that of metal oxide layer 120.

In memory device 100 illustrated in FIG. 1, first metal layer 110 is formed of tungsten (W). Metal oxide layer 120 is formed of a tungsten oxygen compound $WO_x$, such as $WO_3$, $W_2O_5$, or $WO_2$, or a combination thereof. Each of first through fifth oxygen control layers 131-135 is formed of a tungsten oxygen nitrogen compound $WO_xN_y$. Different oxygen control layers 131-135 have different x-to-y ratios. Barrier layer 140 is formed of a tungsten nitrogen compound $WN_y$. Second metal layer 150 is formed of aluminum (Al).

FIG. 2 schematically illustrates a profile of oxygen content (hereinafter referred to as an "oxygen profile") of memory device 100, according to an embodiment. As illustrated in FIG. 2, the oxygen content increases in a stepwise manner along a depth direction starting from fifth oxygen control layer 135, and reaches a maximum in metal oxide layer 120. That is, the oxygen content increases in a series of discrete stages starting from fifth oxygen control layer 135. Each one of first through fifth oxygen control layers 131-135 corresponds to one of the series of discrete stages. In each one of first through fifth oxygen control layers 131-135, oxygen is uniformly distributed throughout the entire layer such that each one of first through fifth oxygen control layers 131-135 has a constant oxygen content throughout. The oxygen content in fifth oxygen control layer 135 is the smallest among the first through fifth oxygen control layers 131-135.

Figure 11:
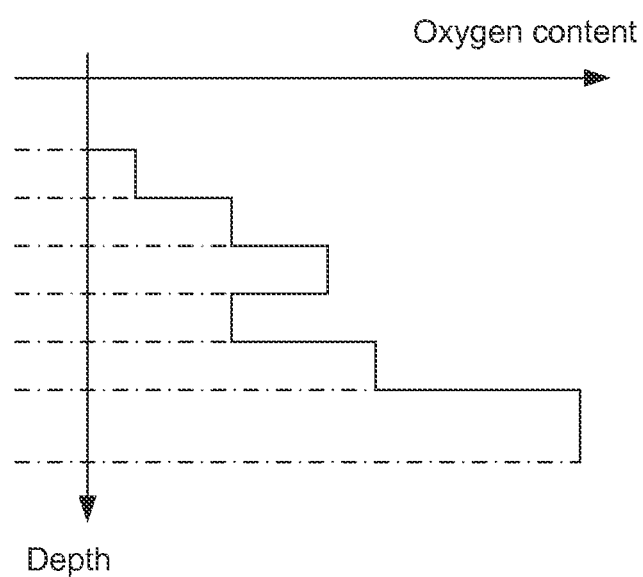
FIG. 11 schematically illustrates an oxygen profile of the memory device of FIG. 1, according to another embodiment.

Although in the illustrated embodiment of FIG. 2, the oxygen content of memory device 100 increases in a stepwise manner, the present disclosure is not so limited. The oxygen content can increase and then decrease along the depth direction to have a local maximum, before reaching the maximum in metal oxide layer 120. FIG. 11 schematically illustrates an oxygen profile of a memory device, according to such an embodiment.

The thickness and the oxygen content of each one of first through fifth oxygen control layers 131-135 are variable. For example, the thickness of each one of first through fifth oxygen control layers 131-135 ranges from several nanometers to several hundreds of nanometers. The oxygen content of each one of first through fifth oxygen control layers 131-135 ranges from 1% to 99%. In addition, the number of oxygen control layers is variable.

Memory device 100 can be formed by sequentially depositing metal oxide layer 120, first through fifth oxygen control layers 131-135, barrier layer 140, and second metal layer 150 on first metal layer 110. The deposition of each of these layers can be performed by various deposition processes, including a downstream plasma incorporated deposition process, an atomic layer deposition process, a furnace deposition process, a rapid thermal deposition process, a physical vapor deposition process, a chemical vapor deposition process, a sputtering deposition process, a chemical reaction deposition process, and a molecular beam epitaxy process. The deposited first through fifth oxygen control layers 131-135 have the stepwise oxygen profile shown as a solid line 210 in FIG. 2.

In some embodiments, after the deposition processes, an annealing process can be performed. As a result of the annealing process, the oxygen profile of memory device 100 becomes a smoothed oxygen profile, shown as a dotted line 220 in FIG. 2.

FIG. 3 is a cross-sectional view of a memory device 300, according to another illustrated embodiment. Memory device 300 includes a first metal layer 310, a barrier layer 320 formed on first metal layer 310, first through fourth oxygen control layers 331-334 sequentially formed on barrier layer 320, a metal oxide layer 340 formed on fourth oxygen control layer 334, and a second metal layer 350 formed on metal oxide layer 340. First through fourth oxygen control layers 331-334 have different oxygen contents. None of first through fourth oxygen control layers 331-334 has an oxygen content greater than that of metal oxide layer 340.

In memory device 300 illustrated in FIG. 3, first metal layer 310 is formed of tungsten (W). Barrier layer 320 is formed of a tungsten nitrogen compound $WN_y$. First through fourth oxygen control layers 331-334 are formed of different tungsten oxygen nitrogen compounds $WO_xN_y$ having different x-to-y ratios. Metal oxide layer 340 is formed of a tungsten oxygen compound $WO_x$. Second metal layer 350 is formed of aluminum (Al).

FIG. 4 schematically illustrates an oxygen profile of memory device 300, according to an embodiment. As illustrated in FIG. 4, the oxygen content in memory device 300 decreases in a stepwise manner along a depth direction starting from metal oxide layer 340. Metal oxide layer 340 has an oxygen content greater than that of any one of first through fourth oxygen control layers 331-334. Although not shown in FIG. 4, an annealing process can be performed on memory device 300 formed with the oxygen profile shown in FIG. 4. As a result of the annealing process, the oxygen profile of memory device 300 becomes smoothed.

FIG. 5 is a cross-sectional view of a memory device 500, according to still another illustrated embodiment. Memory device 500 includes a first metal layer 510, a first barrier layer 520 formed on first metal layer 510, first through third oxygen control layer 531-533 sequentially formed on first barrier layer 520, a metal oxide layer 540 formed on third oxygen control layer 533, fourth through sixth oxygen control layers 551-553 formed on metal oxide layer 540, a second barrier layer 560 formed on sixth oxygen control layer 553, and a second metal layer 570 formed on second barrier layer 560. First through third oxygen control layer 531-533 have different oxygen contents. Fourth through sixth oxygen control layers 551-553 also have different oxygen contents. None of first through sixth oxygen control layers 531-533 and 551-553 has an oxygen content greater than that of metal oxide layer 540.

In memory device 500 illustrated in FIG. 5, first metal layer 510 is formed of tungsten (W). First barrier layer 520 is formed of a tungsten nitrogen compound $WN_y$. First through third oxygen control layers 531-533 are formed of different tungsten oxygen nitrogen compounds $WO_xN_y$ having different x-to-y ratios. Metal oxide layer 540 is formed of a tungsten oxygen compound $WO_x$. Fourth through sixth oxygen control layers 551-553 are formed of different tungsten oxygen nitrogen compounds $WO_xN_y$ having different x-to-y ratios. Second barrier layer 560 is formed of a tungsten nitrogen compound $WN_y$. Second metal layer 570 is formed of aluminum (Al).

FIG. 6 schematically illustrates an oxygen profile of memory device 500, according to an embodiment. As illustrated in FIG. 6, the oxygen content in memory device 500 increases in a stepwise manner along a depth direction starting from sixth oxygen control layer 553, reaches a maximum in metal oxide layer 540, and then decreases in a stepwise manner along the depth direction. Although the oxygen profile in FIG. 6 is symmetric about a central axis of metal oxide layer 540, the embodiment is not so limited. That is, the oxygen content of first oxygen control layer 531 can be different from that of sixth oxygen control layer 553; the oxygen content of second oxygen control layer 532 can be different from that of fifth oxygen control layer 552; and the oxygen content of third oxygen control layer 533 can be different from that of fourth oxygen control layer 551. Although not shown in FIG. 6, an annealing process can be performed on memory device 500 formed with the oxygen profile shown in FIG. 4. As a result of the annealing process, the oxygen profile of memory device 500 becomes smoothed.

Figure 7:
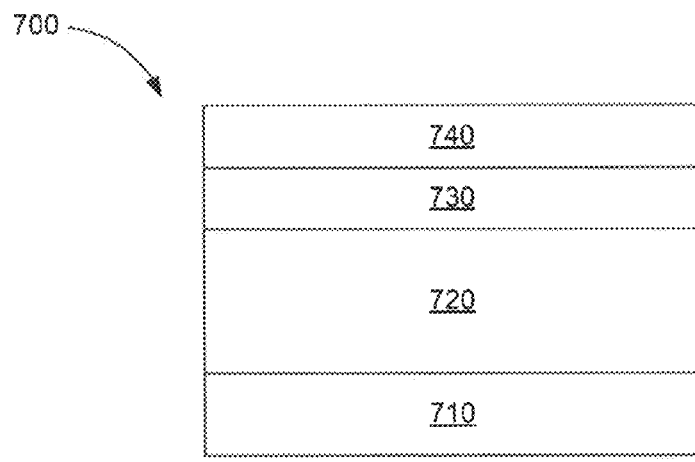
FIG. 7 is a cross-sectional view of a conventional memory device.

FIG. 7 is a cross-sectional view of a memory device 700. As illustrated in FIG. 7, memory device 700 includes a first metal layer 710 formed of tungsten (W), a metal oxide layer 720 formed of tungsten oxide (WO) on first metal layer 710, a barrier layer 730 formed of tungsten nitride ($WN_y$) on metal oxide layer 720, and a second metal layer 740 formed of aluminum (Al) on barrier layer 730. Memory device 700 does not include any oxygen control layer.

Figure 8:
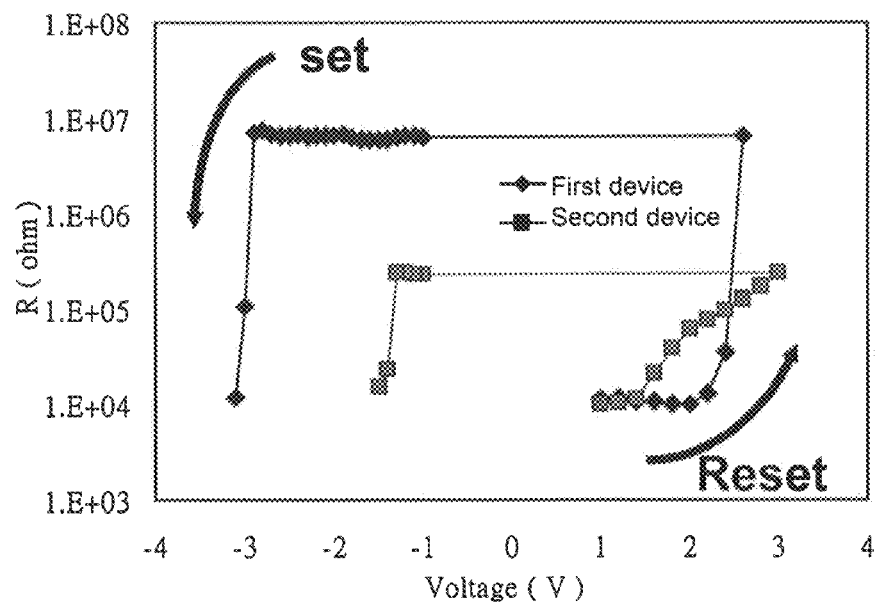
FIG. 8 is a graphical illustration of resistance versus voltage characteristics of a first memory device constructed according to an embodiment, and a second memory device constructed as a comparative example.

FIG. 8 is a graphical illustration of resistance versus voltage characteristics of a first memory device constructed as an example according to an embodiment, and a second memory device constructed as a comparative example. The first memory device is similar to memory device 100 illustrated in FIG. 1, except that the oxygen control layers are formed of W(Si)$_x$O$_y$ with different x-to-y ratios. The second memory device is similar to memory device 700 illustrated in FIG. 7.

As illustrated in FIG. 8, the resistance state of the first device is reset from "0" to "1" when the voltage applied across second metal layer 150 and first metal layer 110 increases from 1 V and reaches about 2.5 V, and the resistance state of the first device is set from "1" to "0" when the voltage applied across second metal layer 150 and first metal layer 110 decreases from −1 V and reaches about −3 V. On the other hand, the resistance state of the second device is reset from "0" to "1" when the voltage applied across second metal layer 740 and first metal layer 710 increases from 1 V and reaches about 3 V, and the resistance state of the second device is set from "1" to "0" when the voltage applied across second metal layer 740 and first metal layer 710 decreases from −1 V and reaches about −1.5 V. Therefore, the first device and the second device have different set and reset voltages, and thus have different electrical operation windows. Such a difference between the first device and the second device is the result of the presence of the oxygen control layers in the first device.

Figure 9:
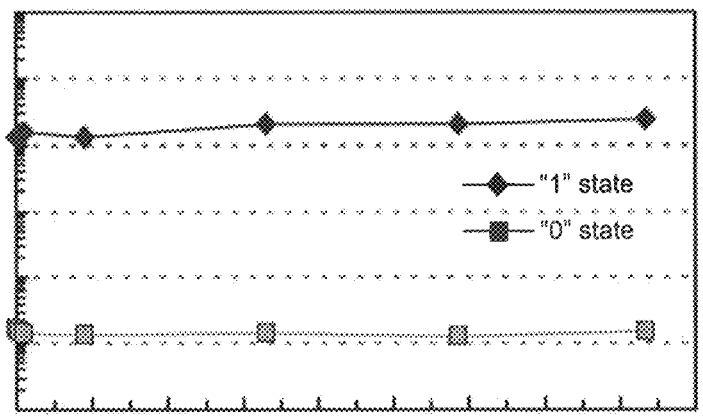
FIG. 9 is a graphical illustration of results of a retention test performed on the first memory device.

FIG. 9 is a graphical illustration of results of a retention test performed on the first memory device. During the retention test, the resistance state of the first memory device is reset to "1", and is periodically measured during a time period of 170 hours. Then, the resistance state of the first memory device is set to "0", and is periodically measured during a time period of 170 hours. The retention test result shows that the first memory device is stable for at least 170 hours.

Figure 10:
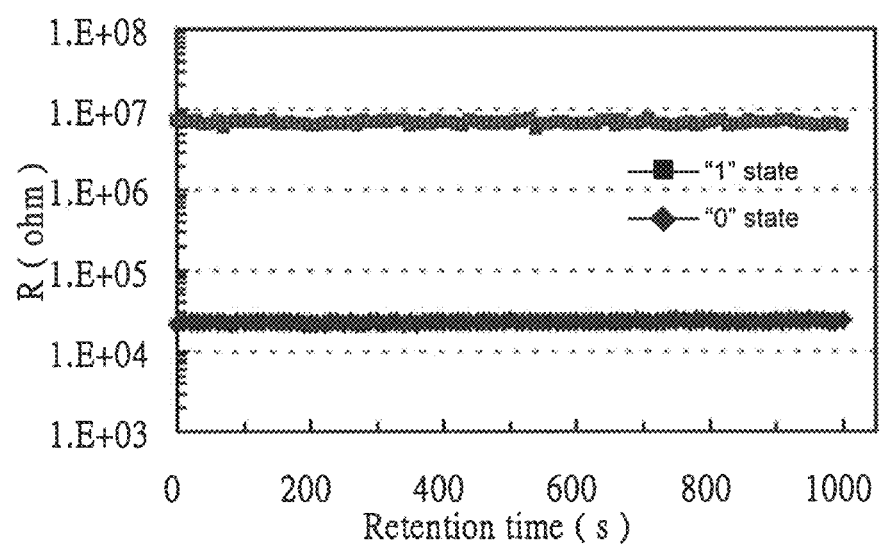
FIG. 10 is a graphical illustration of results of a read disturbance test performed on the first memory device.

FIG. 10 is a graphical illustration of results of a read disturbance test performed on the first memory device. During the read disturbance test, the resistance state of the first memory device is reset to "1", and a read voltage of 0.2 V is periodically applied to the first memory device to measure its resistance. Then, the resistance state of the first memory device is set to "0", and a read voltage of 0.2 V is periodically applied to the first memory device to measure its resistance. The read disturbance test result shows that the first memory device has good immunity to read disturbance.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A memory device, comprising:
   a first metal layer and a second metal layer;
   a metal oxide layer disposed between the first metal layer and the second metal layer; and
   a plurality of oxygen control layers disposed between the metal oxide layer and at least one of the first metal layer and the second metal layer,
   wherein the oxygen content of the plurality of oxygen control layers increases in a stepwise manner from the at least one of the first metal layer and the second metal layer, reaches a local maximum, decreases in a stepwise manner, and then increases in a stepwise manner until reaching a second maximum in the metal oxide layer.

2. The memory device of claim 1, further including a barrier layer disposed between the plurality of oxygen control layers and the at least one of the first metal layer and the second metal layer.

3. The memory device of claim 1, wherein the metal oxide layer is formed of a metal oxygen compound represented by AOx, A being a metal selected from a group consisting of W, Ti, TiN, Al, Ni, Cu, Zr, Nb, and Ta, or any combination thereof.

4. The memory device of claim 1, wherein each one of the first and second metal layers is formed of a metal selected from a group consisting of W, Ti, TiN, Al, Ni, Cu, Zr, Nb, Ta, Yb, Tb, Y, La, Sc, Hf, Zr, Cr, V, Zn, Mo, Re, Ru, Co, Rh, Pd, and Pt, or any combination thereof.

5. The memory device of claim 1, wherein each one of the plurality of oxygen control layers is formed of a compound represented by AOxBy, A being a metal selected from a group consisting of W, Ti, TiN, Al, Ni, Cu, Zr, Nb, and Ta, or any combination thereof, and B being an element selected from a group consisting of N, Si, Ge, As, Ga, In, and P, or any combination thereof.

6. The memory device of claim 5, wherein x-to-y ratios of the plurality of oxygen control layers change over a thickness of the plurality of oxygen control layers.

7. A method of manufacturing a memory device, comprising:
   forming a first metal layer;
   forming a metal oxide layer over the first metal layer;
   forming a second metal layer over the metal oxide layer; and
   forming a plurality of oxygen control layers between the metal oxide layer and at least one of the first metal layer and the second metal layer,
   wherein the oxygen content of the plurality of oxygen control layers increases in a stepwise manner from the at least one of the first metal layer and the second metal layer, reaches a local maximum, decreases in a stepwise manner, and then increases in a stepwise manner until reaching a second maximum in the metal oxide layer.

8. The method of claim 7, further including forming a barrier layer between the plurality of oxygen control layers and the at least one of the first metal layer and the second metal layer.

9. The method of claim 7, wherein the forming of the metal oxide layer includes forming a layer of a metal oxygen compound represented by AOx, A being a metal selected from a group consisting of W, Ti, TiN, Al, Ni, Cu, Zr, Nb, and Ta, or any combination thereof.

10. The method of claim 7, wherein the forming of each one of the first and second metal layers includes forming a layer of a metal selected from a group consisting of W, Ti, TiN, Al, Ni, Cu, Zr, Nb, Ta, Yb, Tb, Y, La, Sc, Hf, Zr, Cr, V, Zn, Mo, Re, Ru, Co, Rh, Pd, and Pt, or any combination thereof.

11. The method of claim 7, wherein the forming of the plurality of oxygen control layers includes forming a a plurality of layers of compounds each represented by AOxBy, A being a metal selected from a group consisting of W, Ti, TiN, Al, Ni, Cu, Zr, Nb, and Ta, or any combination thereof, and B being an element selected from a group consisting of N, Si, Ge, As, Ga, In, and P, or any combination thereof.

12. The method of claim 11, wherein x-to-y ratios of the plurality of layers of compounds change over a thickness of the plurality of oxygen control layers.

13. The method of claim 7, further comprising annealing the plurality of oxygen control layers and the metal oxide layer.

* * * * *